(12) United States Patent
Yamashita et al.

(10) Patent No.: US 9,012,997 B2
(45) Date of Patent: Apr. 21, 2015

(54) SEMICONDUCTOR DEVICE INCLUDING ESD PROTECTION DEVICE

(71) Applicant: International Business Machines Corporation, Armonk, NY (US)

(72) Inventors: Tenko Yamashita, Schenectady, NY (US); Terence B. Hook, Jericho, VT (US); Veeraraghavan S. Basker, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 13/661,683

(22) Filed: Oct. 26, 2012

(65) Prior Publication Data

US 2014/0117490 A1 May 1, 2014

(51) Int. Cl.
*H01L 23/62* (2006.01)
*H01L 27/02* (2006.01)
*H01L 29/66* (2006.01)

(52) U.S. Cl.
CPC ...... *H01L 27/0255* (2013.01); *H01L 29/66121* (2013.01); *H01L 29/6609* (2013.01)

(58) Field of Classification Search
CPC ............ H01L 27/0255; H01L 29/6609; H01L 29/66121; H01L 29/66136; H01L 23/60
USPC .................. 257/328, 355, 546; 438/237
See application file for complete search history.

(56) References Cited

U.S. PATENT DOCUMENTS

| | | | |
|---|---|---|---|
| 4,736,271 A | 4/1988 | Mack et al. | |
| 5,856,214 A | 1/1999 | Yu | |
| 6,034,399 A | 3/2000 | Brady et al. | |
| 6,352,882 B1 * | 3/2002 | Assaderaghi et al. | 438/155 |
| 6,388,302 B1 | 5/2002 | Galli | |
| 6,611,024 B2 * | 8/2003 | Ang et al. | 257/350 |
| 6,670,677 B2 * | 12/2003 | Choe et al. | 257/355 |
| 7,009,249 B2 * | 3/2006 | Nii | 257/347 |
| 7,186,596 B2 * | 3/2007 | Min et al. | 438/149 |
| 7,384,854 B2 * | 6/2008 | Voldman | 438/380 |
| 7,429,523 B2 * | 9/2008 | Kocon | 438/570 |
| 7,888,775 B2 | 2/2011 | Russ et al. | |
| 7,910,951 B2 | 3/2011 | Vashchenko | |
| 7,915,658 B2 * | 3/2011 | Pellela et al. | 257/300 |

(Continued)

FOREIGN PATENT DOCUMENTS

JP    1996032057 A  *  2/1996

OTHER PUBLICATIONS

Machine translation of JP 1996032057 A.*

(Continued)

*Primary Examiner* — Fernando L Toledo
*Assistant Examiner* — Bryan Junge
(74) *Attorney, Agent, or Firm* — Cantor Colburn LLP; Vazken Alexanian

(57) ABSTRACT

A semiconductor device includes a semiconductor-on-insulator (SOI) substrate having a bulk substrate layer, an active semiconductor layer and a buried insulator layer disposed between the bulk substrate layer and the active semiconductor layer. A trench is formed through the SOI substrate to expose the bulk substrate layer. A doped well is formed in an upper region of the bulk substrate layer adjacent trench. The semiconductor device further includes a first doped region different from the doped well that is formed in the trench.

21 Claims, 15 Drawing Sheets

(56) References Cited

U.S. PATENT DOCUMENTS

| | | |
|---|---|---|
| 8,034,716 B2 | 10/2011 | Gonzalez et al. |
| 8,080,851 B2 | 12/2011 | Barth, Jr. et al. |
| 2007/0145411 A1 | 6/2007 | Chen et al. |
| 2008/0251846 A1 | 10/2008 | Voldman |
| 2010/0052100 A1 | 3/2010 | Barth, Jr. et al. |
| 2011/0095347 A1 | 4/2011 | Russ et al. |
| 2012/0043583 A1 | 2/2012 | Abou-Khalil et al. |
| 2012/0049270 A1* | 3/2012 | Hirler et al. .................. 257/328 |
| 2012/0261804 A1 | 10/2012 | Li et al. |

OTHER PUBLICATIONS

International Search Report for corresponding PCT Application No. PCT/US2013/054065, dated Jan. 29, 2014, pp. 1-7.

Written Opinion of the International Searching Authority for corresponding PCT Application No. PCT/US2013/054065, dated Jan. 29, 2014, pp. 1-6.

* cited by examiner

SEMICONDUCTOR DEVICE INCLUDING ESD PROTECTION DEVICE

BACKGROUND

Various embodiments of the present invention relate generally to semiconductor devices, and more specifically, to a semiconductor device including an ESD protection device.

Electrostatic discharge (ESD) is caused by a discharge of an excess or deficiency of electrons on one surface with respect to another surface or to ground. When a static charge exists on an object, electrons become electrically imbalanced. ESD occurs when the imbalanced electrons attempt to reach equilibrium by traveling to another object having a different voltage potential via a discharge path. However, an electrostatic field corresponding to the discharge path can permanently damage ESD-sensitive devices, such as a field effect transistor (FET) or other semiconductor device.

Semiconductor devices may include an ESD protection device, such as a buried ESD diode structure disposed under a buried insulator of a semiconductor-on-insulator substrate to protect the semiconductor device from ESD. Deep contacts are required to connect the anode and cathode of the buried ESD diode. When a high-voltage event caused by ESD occurs, the buried ESD diode may shunt current below the buried insulator, which effectively protects the semiconductor device from ESD damage. Further, an increase in thermal dissipation of the heat caused by the ESD may be realized by burying the ESD diode below the buried insulator.

Recent trends in technology have encouraged a reduction in the size of semiconductor devices. As stated above, however, the conventional buried ESD diode requires deep contacts to connect the anode and cathode. Consequently, a reduction in size of a semiconductor device including a conventional ESD diode is limited by the deep contacts.

SUMMARY

According to at least one embodiment, a semiconductor device comprises a semiconductor-on-insulator (SOI) substrate including a bulk substrate layer, an active semiconductor layer and a buried insulator layer disposed between the bulk substrate layer and the active semiconductor layer. A trench is formed through the SOI substrate to expose the bulk substrate layer. A doped well is formed in the bulk substrate layer adjacent the trench. The semiconductor device further includes at least one doped region different from the doped well formed in the trench.

According to another embodiment, an electrostatic discharge (ESD) protection device comprises a doped well formed in a bulk substrate layer of a semiconductor-on-insulator (SOI) substrate. A first doped region is formed in a trench of the SOI substrate. The ESD protection device further includes a second doped region different from the first doped region. The second doped region is formed vertically in the trench of the SOI substrate with respect to the first doped region.

In yet another embodiment, a method of fabricating a semiconductor device comprises forming a trench through a semiconductor-on-insulator (SOI) substrate to expose a bulk substrate layer. The SOI substrate includes the bulk substrate layer, an active semiconductor layer and a buried insulator layer. The buried insulator is disposed between the bulk substrate layer and the active semiconductor layer. The method further includes forming a doped well in the bulk substrate layer adjacent the trench, and forming at least one doped region in the trench to contact the doped well. The at least one doped region is different from the doped well.

In still another embodiment, a method of fabricating an electrostatic discharge (ESD) protection device comprises forming a doped well in a bulk substrate layer of a semiconductor-on-insulator (SOI) substrate. The method further includes forming a first doped region in a trench of the SOI substrate and a second doped region in the trench of the SOI substrate. The second doped region is different from the first doped region and is formed vertically with respect to the first doped region.

Additional features and utilities are realized through the various embodiments. Other embodiments and features are described in detail herein and are considered a part of the disclosed embodiments. For a better understanding of the features of the various embodiments, refer to the description and to the drawings.

BRIEF DESCRIPTION OF THE SEVERAL VIEWS OF THE DRAWINGS

The subject matter described herein is particularly pointed out and distinctly claimed in the claims at the conclusion of the specification. The forgoing and other features are apparent from the following detailed description taken in conjunction with the accompanying drawings. FIGS. 1-13 are a series of views illustrating a method of forming a semiconductor device according to the various embodiments, in which:

FIG. 1 illustrates a cross-sectional view of a semiconductor-on-insulator (SOI) starting substrate;

FIG. 2 illustrates formation of a first mask layer on an active semiconductor layer of the SOI substrate shown in FIG. 1;

FIG. 3 illustrates the SOI substrate of FIG. 2 following an etching process to form a trench that exposes a bulk substrate layer;

FIG. 4 illustrates formation of a spacer layer on the first mask layer and in the trench of the SOI substrate shown in FIG. 3;

FIG. 5 illustrates the SOI substrate illustrated in FIG. 4 following etching of the spacer layer to form spacers on sidewalls of the trench;

FIG. 6 illustrates deposition of ions in the exposed bulk substrate layer of the SOI substrate shown in FIG. 5;

FIG. 7 illustrates formation of a doped well following the deposition of ions in the exposed bulk substrate of the SOI substrate shown in FIG. 6;

FIG. 8 illustrates formation of a first doped region in the trench of the SOI substrate illustrated in FIG. 7;

FIG. 9 illustrates the SOI substrate shown in FIG. 8 after filing the trench with a field oxide material;

FIG. 10 illustrates the SOI substrate shown in FIG. 9 having a mask partially formed on the spacer layer and the field oxide material;

FIG. 11 illustrates formation of a cavity following etching of an exposed portion of the field oxide layer of the SOI substrate shown in FIG. 10;

FIG. 12 illustrates the SOI substrate shown in FIG. 11 after removing the mask and forming a second doped region in the cavity; and FIG. 13 illustrates formation of conductive terminals in the first and second doped regions of the SOI substrate shown in FIG. 12.

DETAILED DESCRIPTION

Figure 1:
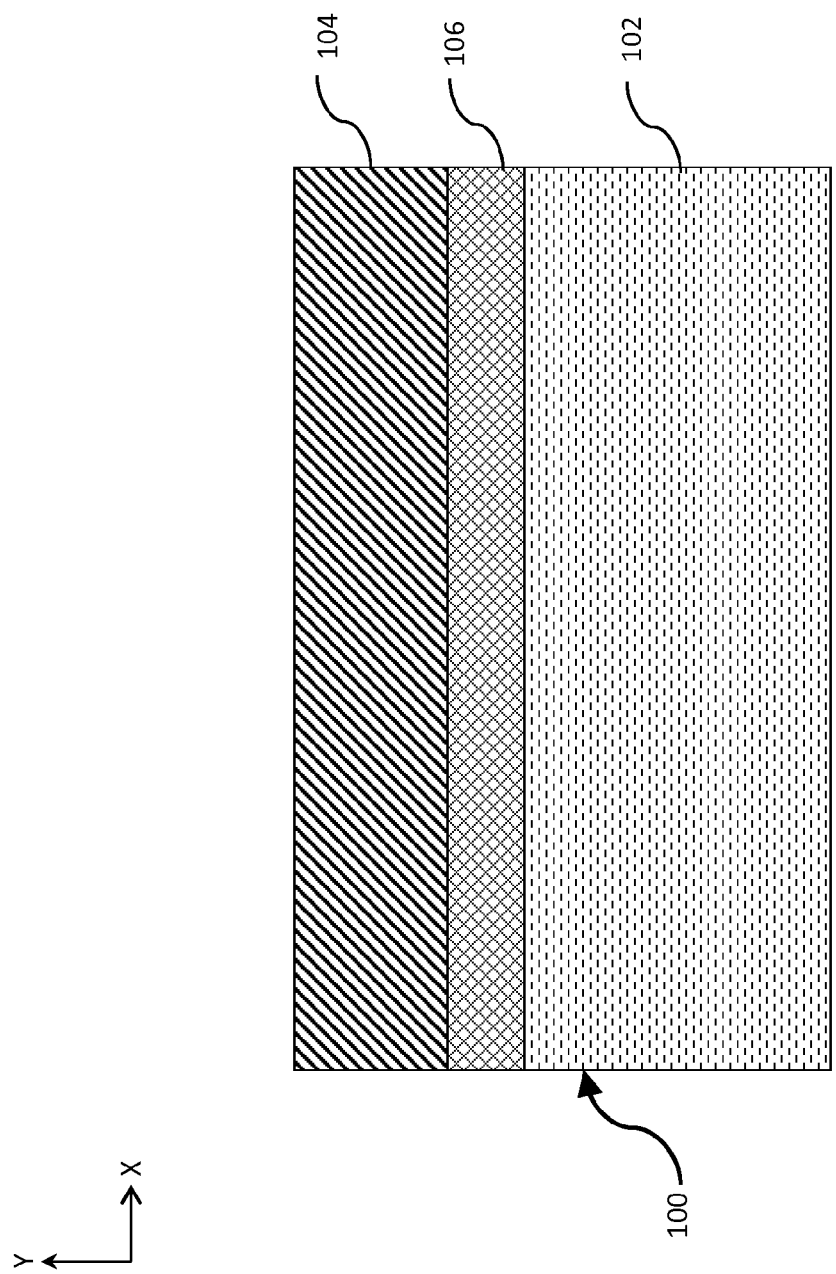

Referring now to FIG. 1, a starting SOI substrate 100 is illustrated. The SOI substrate 100 may extend along an X-axis to define a length, and a Y-axis perpendicular to the X-axis to define a width. The SOI substrate 100 includes a bulk substrate layer 102 and an active semiconductor layer 104. The bulk substrate layer 102 and active semiconductor layer 104 may be formed from a semiconductor material such as, for example, silicon (Si). The active semiconductor layer 104 may also be formed from a semiconductor material including, but not limited to, Ge, SiGe, GeC, SiGeC and SiC. The bulk substrate layer 102 may have a width of about 100 nanometers (nm) to about 200 nm. The active semiconductor layer 104 may have a width of about 20 nm to about 40 nm. The SOI substrate 100 further includes a buried insulator layer, such as a buried oxide (BOX) layer 106 for example, formed between the bulk substrate layer 102 and the active semiconductor layer 104. The BOX layer 106 may comprise, for example, silicon oxide ($SiO_2$) to isolate the active semiconductor layer 104 from the bulk substrate layer 102. Further, the BOX layer 106 may have a width of about 130 nm to about 150 nm.

Figure 2:
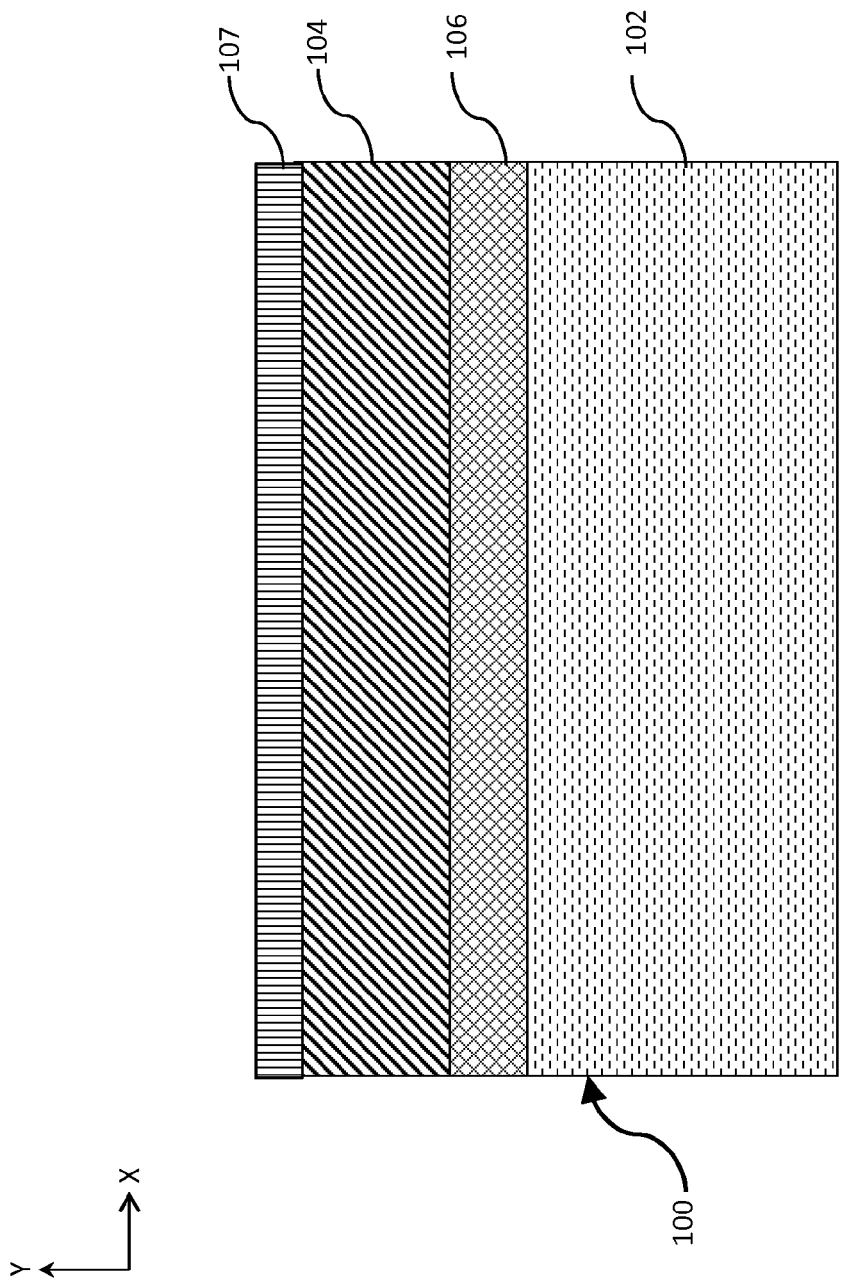
Figure 3:
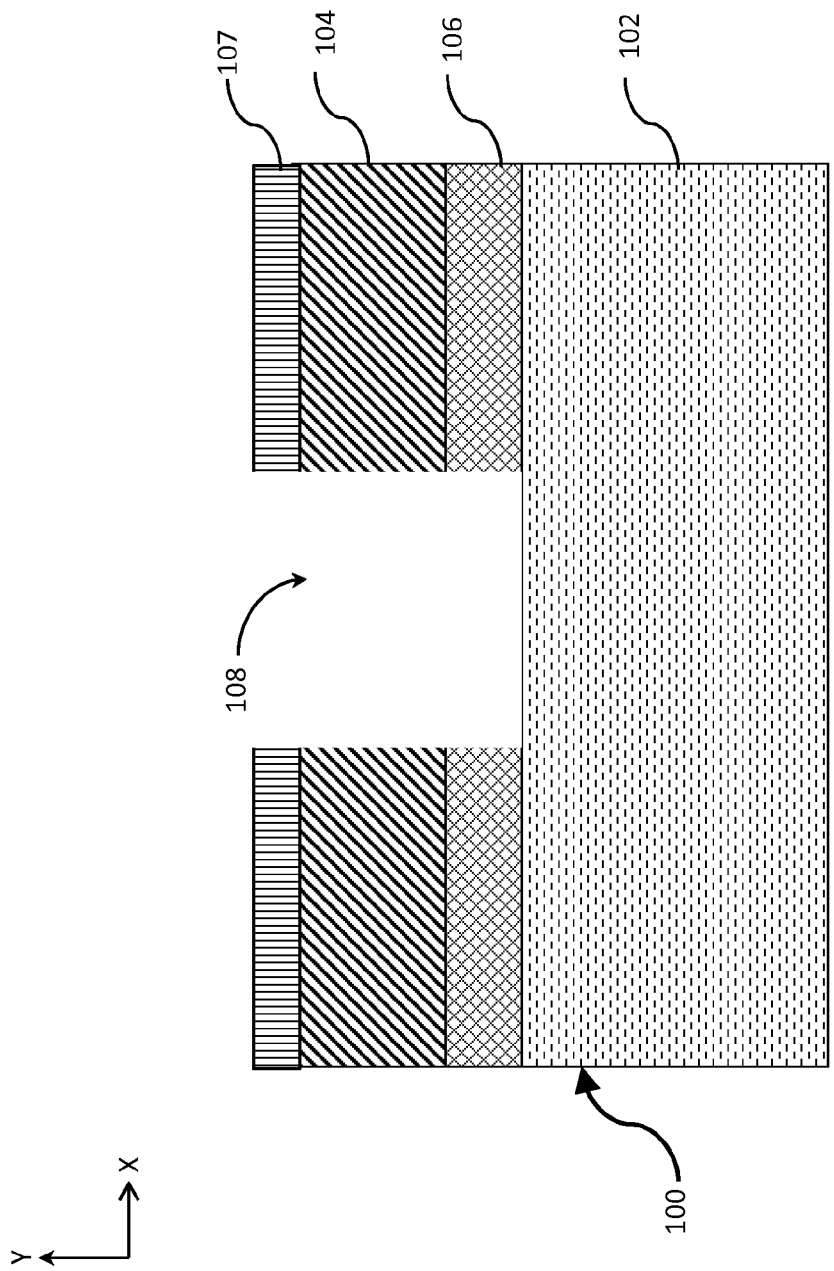

Referring to FIG. 2, a first masking layer 107 is formed on the active semiconductor layer 104 of the SOI substrate 100. The first masking layer 107 may be formed of various materials including, but not limited to, silicon mononitride (SiN) and silicon nitride ($Si_3N_4$). The SOI substrate 100 is then etched to form a trench 108 that extends through the masking layer 107, the active semiconductor layer 104 and the BOX layer 106, as illustrated in FIG. 3. The trench 108 may be formed according to various etching process including, but not limited to, reactive-ion etching (RIE). In at least one embodiment, the first masking layer 107, the active semiconductor layer 104 and the BOX layer 106 are etched to expose a portion, i.e., an upper surface for example, of the bulk substrate layer 102 as further illustrated in FIG. 3.

Figure 4:
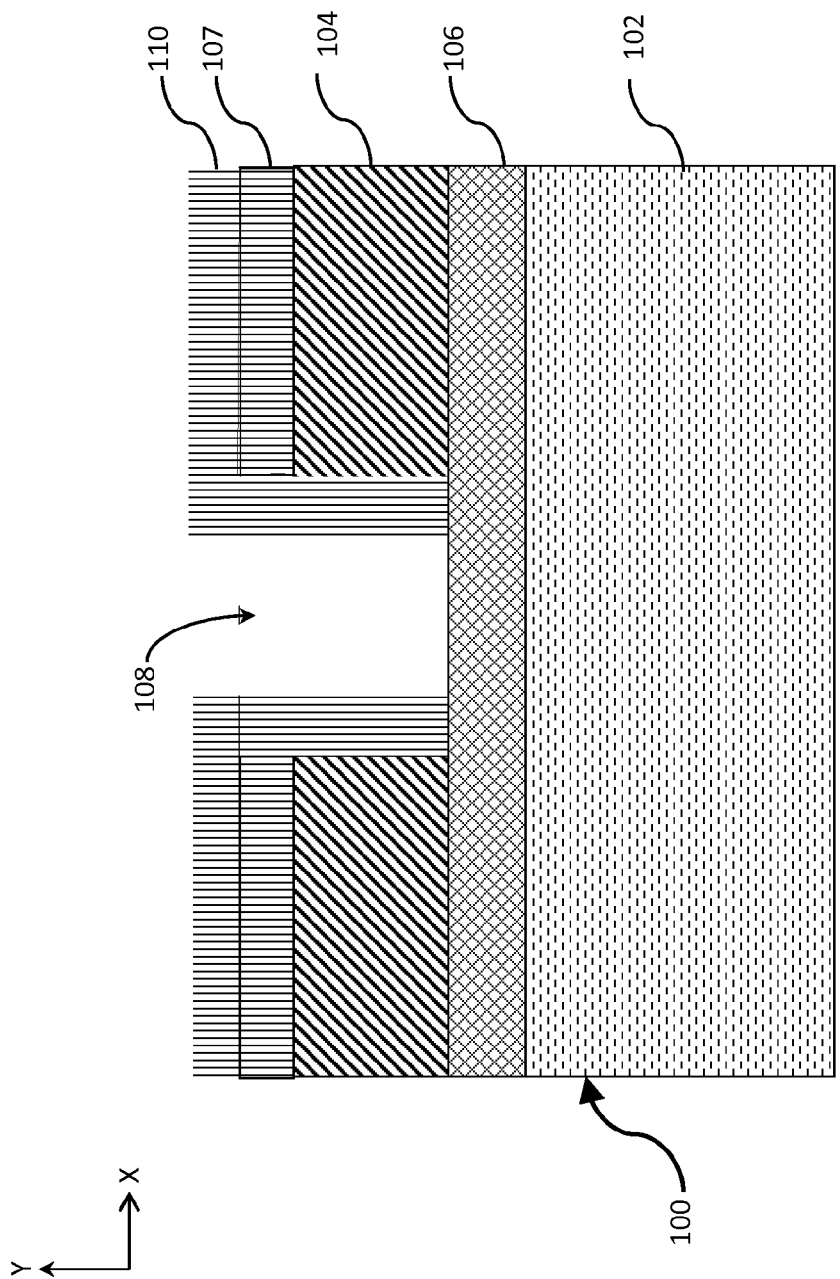

A spacer layer 110 may be formed on the SOI substrate 100 as illustrated in FIG. 4. In particular, the spacer layer 110 may be formed on the first masking layer 107, and may extend into the trench 108 to cover inner sidewalls of the trench 108 and the exposed bulk substrate layer 102, as further illustrated in FIG. 4. The spacer layer 110 may be formed of various materials including, but not limited to, silicon mononitride (SiN) and silicon nitride ($Si_3N_4$).

Figure 5:
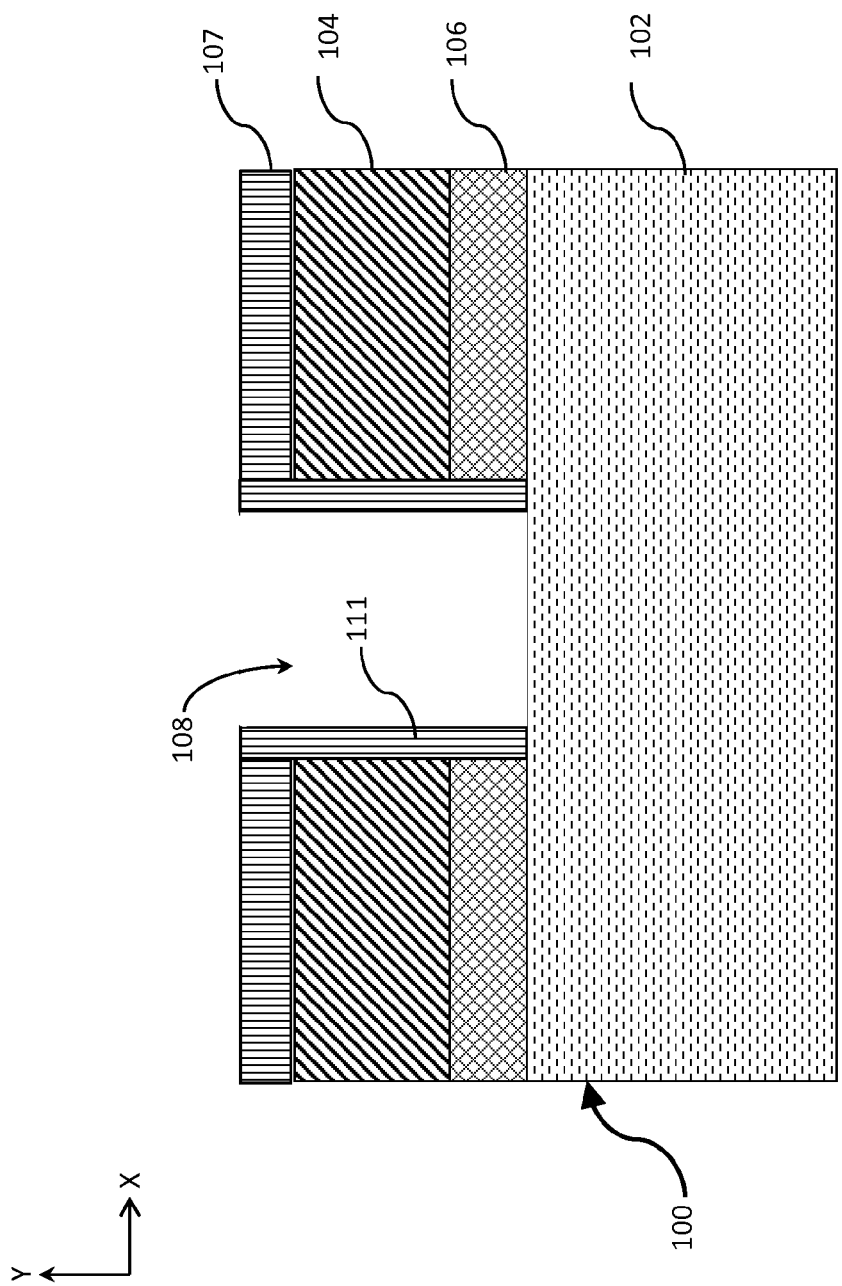
Figure 6:
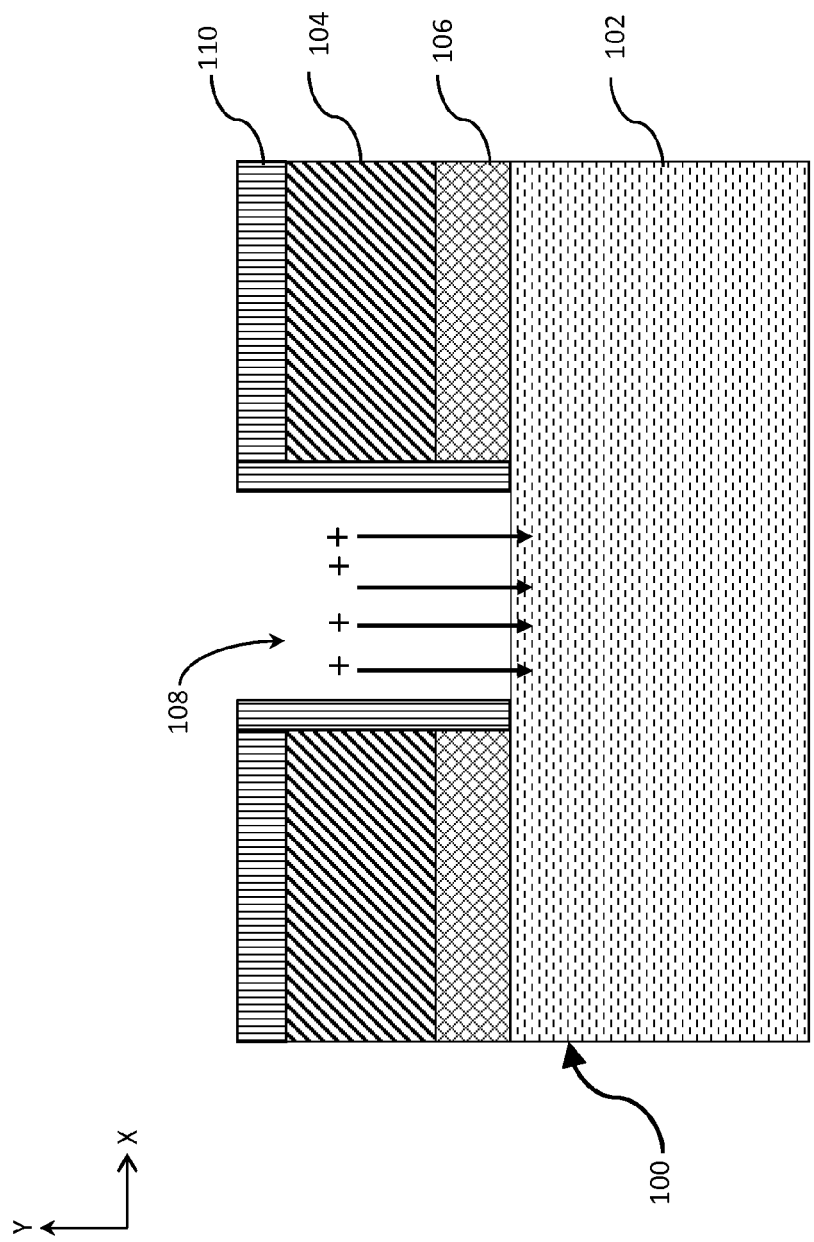

Referring now to FIG. 5, the spacer layer 110 may be etched to form spacers 111 on inner sidewalls of the trench 108. The spacer layer 110 may be etched using various methods including, but not limited to, RIE and sidewall image transfer (SIT). Further, the spacer layer 110 formed on the bulk substrate layer 102 may be etched to re-expose a portion of the bulk substrate layer 102.

Figure 7:
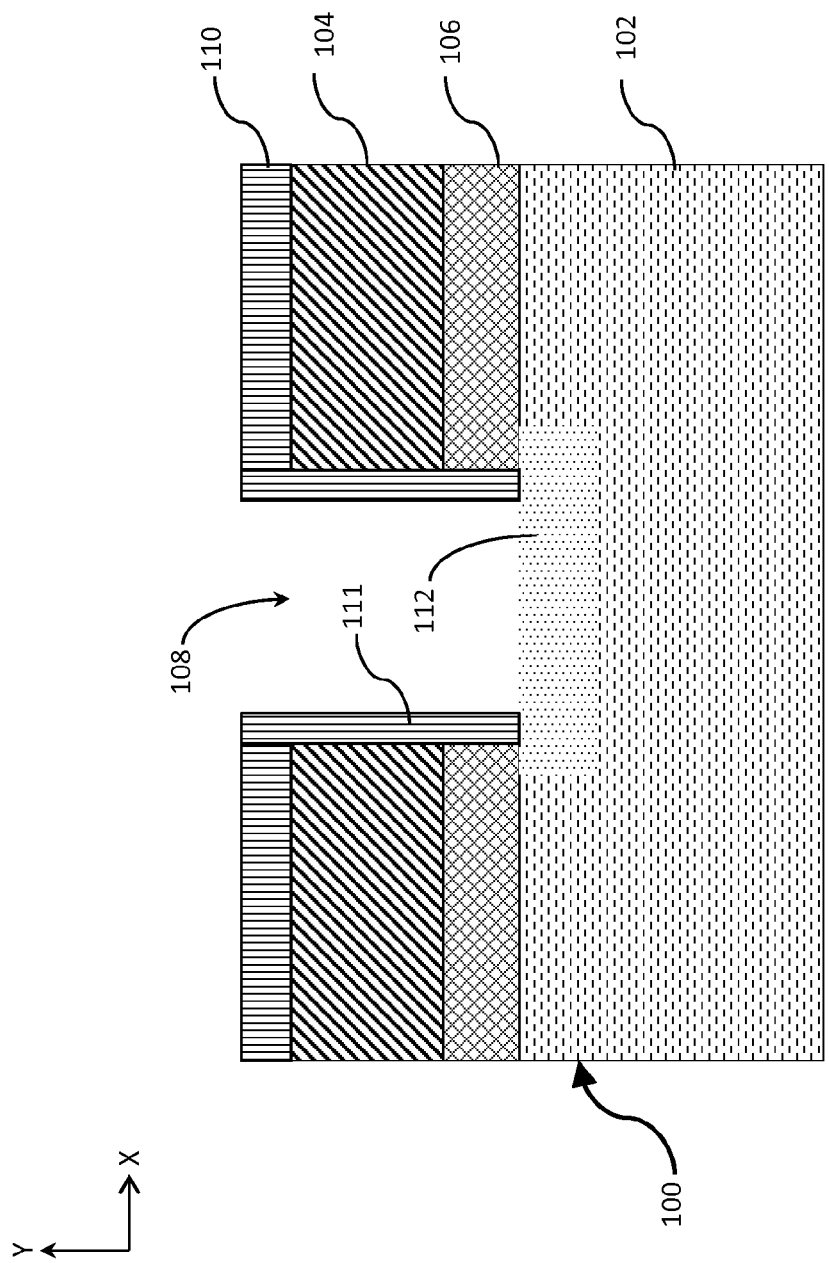

Referring to FIG. 7, ions (+) may be deposited in the exposed portion of the bulk substrate 102 according well-known ion implantation techniques. The deposited ions (+) form a doped well 112 in the bulk substrate layer 102, as further illustrated in FIG. 7. In at least one embodiment, the doped well 112 is an N-well deposited with negatively charged ions such as, for example, phosphorus or arsenic. However, it can be appreciated that the doped well 112 may be a P-well having positively charged ions such as, for example, gallium or boron deposited therein. The doped well 112 may be formed according to various shapes and dimensions. For example, at least one embodiment includes a doped well 112 formed in an upper region of the bulk substrate layer 102 adjacent the trench 108, and having one or more doped portions extending beneath one or more spacers 111 and/or the BOX layer 106. The doped well 112 may have a width ranging from about 1 nm to about 2 nm. In another related embodiment, not shown, the doped well 112 may be formed in the exposed portion of the doped well 112 without including portions that extend beneath the spacers 111. The doped well 112 may serve as a depletion region of an ESD protection device, as discussed in greater detail below.

Figure 8:
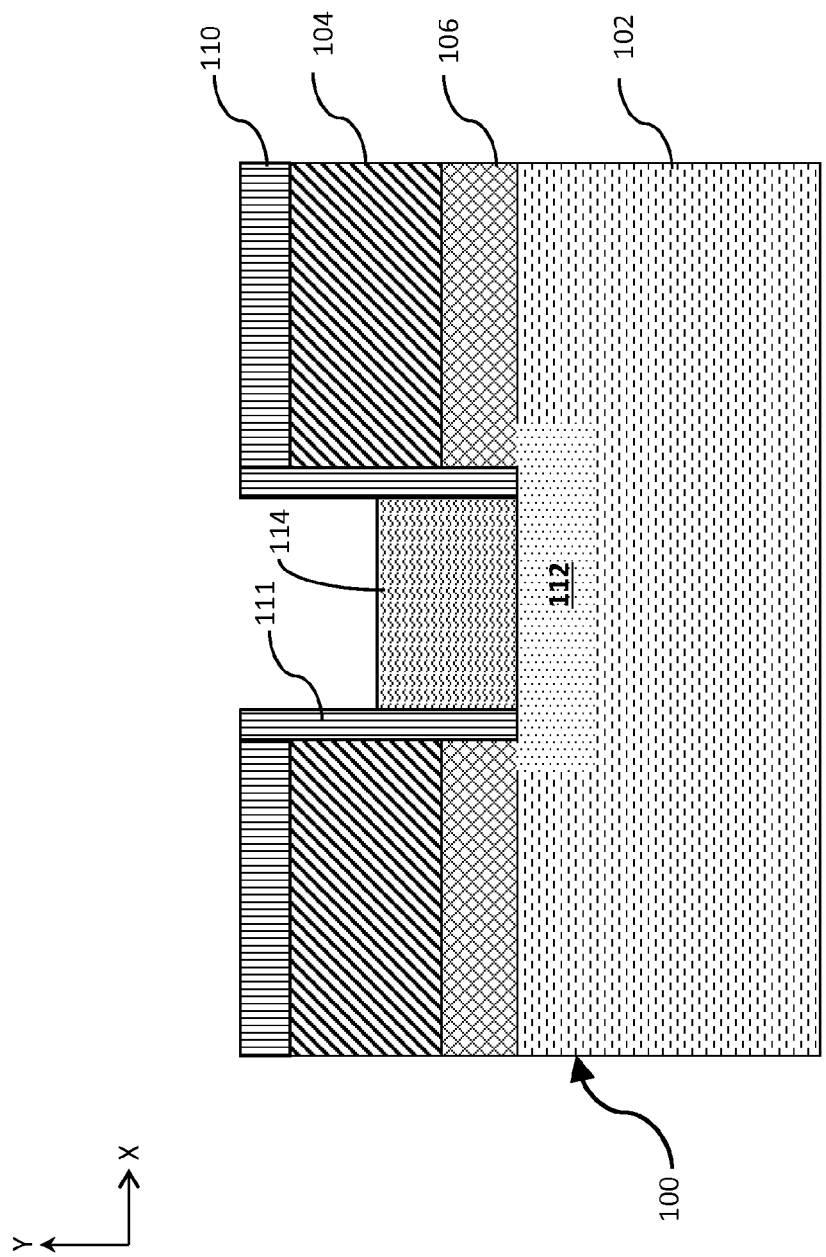

Referring now to FIG. 8, a first doped region 114 is formed in the trench 108. In at least one embodiment, the first doped region 114 may have a width ranging from about 90 nm to about 110 nm and may partially fill the trench 108. The first doped region 114 contacts the doped well 112 to form an electrically conductive path that allows electrical current to flow therethrough. The first doped region 114 includes ions having an electrical polarity different from the ions deposited in the doped well 112. For example, if the doped well 112 is an N-well, the first doped region 114 may be formed from a material including positively charged ions such as gallium or boron. Alternatively, if the doped well 112 is a P-well, the first doped region 114 may be formed from material including negatively charged ions such as phosphorous or arsenic.

Figure 9:
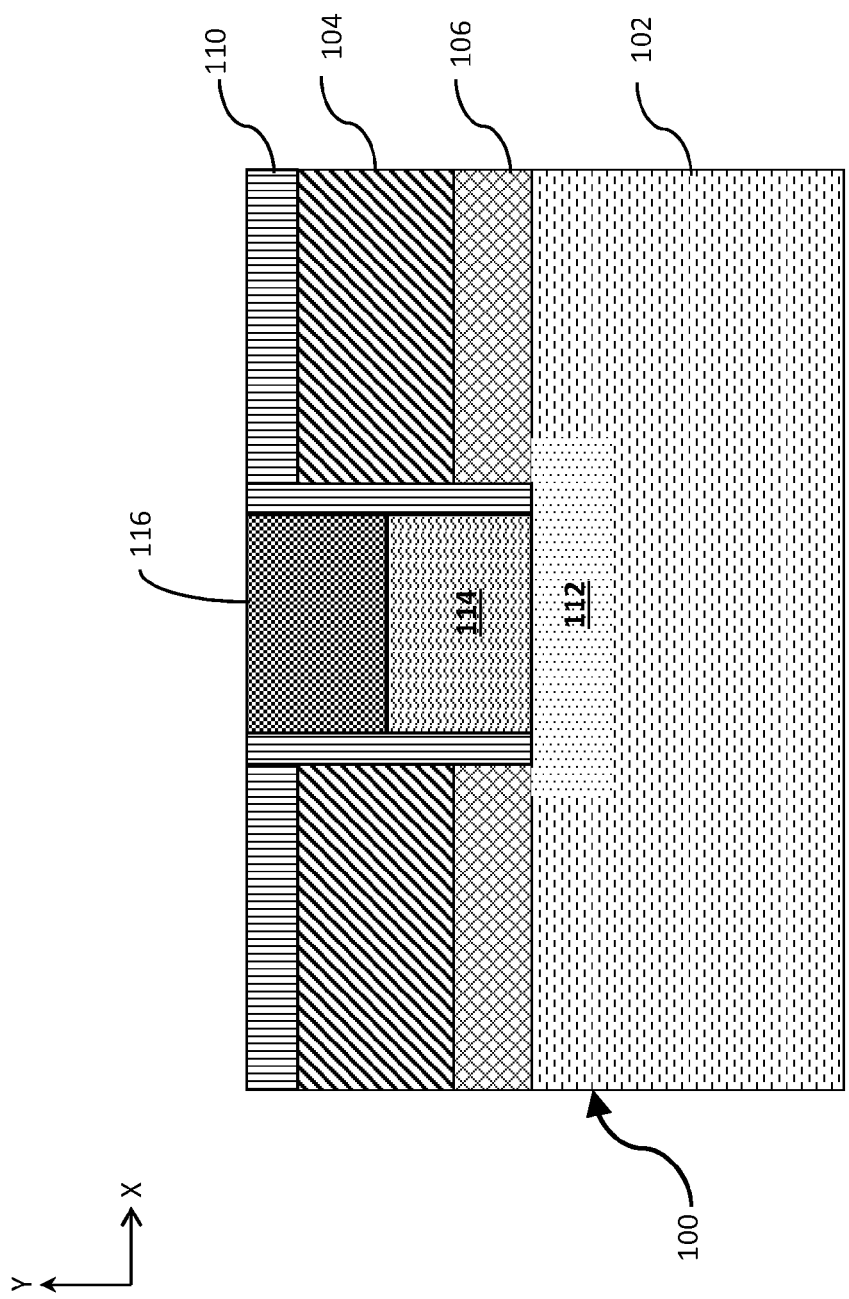

An isolation element 116 may be disposed in a remaining area of the trench 108 to isolate the first doped region 114, as illustrated in FIG. 9. The isolation element 116 may be formed by depositing a field oxide (FOX) material such as, for example, $SiO_2$ in the trench 108. The FOX material may be deposited using various methods including, but not limited to, chemical vapor deposition (CVD).

Figure 10:
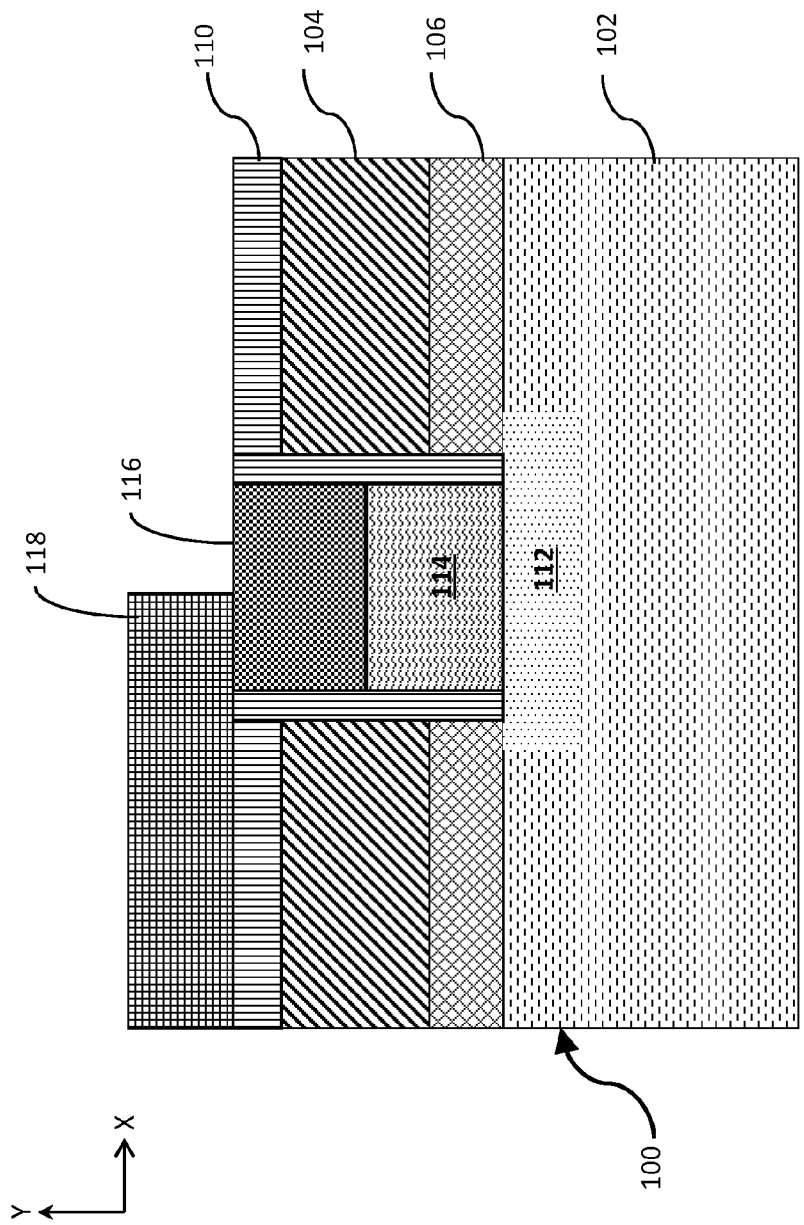
Figure 11:
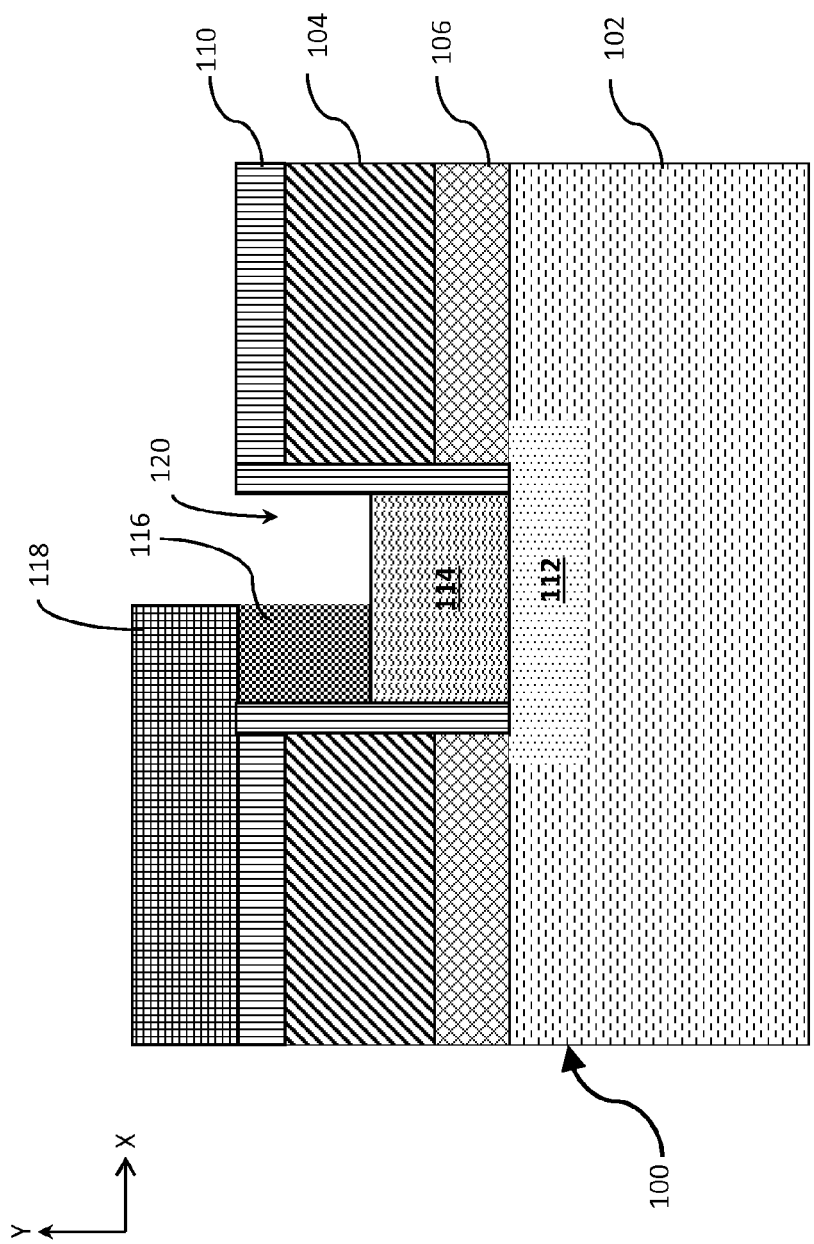

Referring now to FIG. 10, a mask 118 comprising, for example, a photoresist material may be formed on the spacer layer 110 of the SOI substrate 100. The mask 118 may be partially patterned according to a lithography process to expose a portion of the isolation element 116, as further illustrated in FIG. 10. The exposed portion of the isolation element 116 may be removed according to, for example, RIE to form a cavity 120 that exposes a portion of the first doped region 114 as illustrated in FIG. 11.

Figure 12:
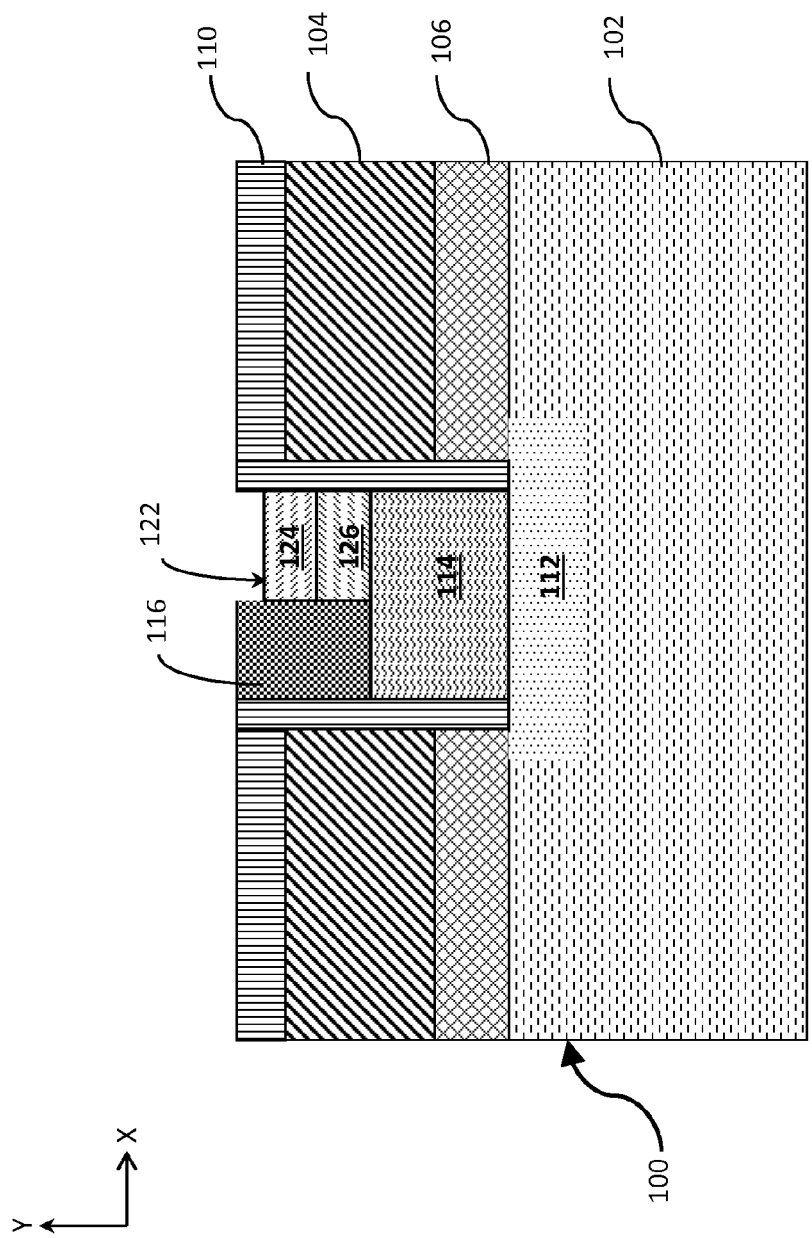

Referring to FIG. 12, the remaining portion of the mask 112 may be removed and a second doped region 122 may be formed in the cavity 120. The second doped region 122 contacts the first doped region 114 to form an electrically conductive path that allows electrical current to flow therethrough. In at least one embodiment, the second doped region 122 is epitaxially grown on the exposed surface of the first doped region 114. The second doped region 122 may be formed from a material including ions having an electrical polarity that is different from the ions deposited in the first doped region 114. For example, if the first doped region 114 comprises positively charged ions, the second doped region 122 may be formed from a material including negatively charged ions such as gallium or boron. Alternatively, if the first doped region 114 comprises negatively charged ions, the second doped region 122 may be formed from a material including positively charged ions such as phosphorous or arsenic. Furthermore, the second doped region 122 may comprise a heavy doped portion 124 and a light doped portion 126. The heavy doped portion 124 increases the electrical conductivity of the second doped region 122. The light doped portion 126 is disposed between the first doped region 114 and the heavy doped portion 124 to reduce current leakage therefrom. In at least one embodiment, the light doped portion 124 comprises an amount of ions ranging from about $1 \times 10^{10}$ to about $-1 \times 10^{20}$ and the heavy doped portion 126 comprises an amount of ions ranging from about $5 \times 10^{10}$ to about 5×10²⁰. In addition, the heavy doped portion 124 may have a width ranging from about 40 nm to about 60 nm, and the light doped portion 126 may have a width ranging from about 10 nm to about 30 nm.

Figure 13:
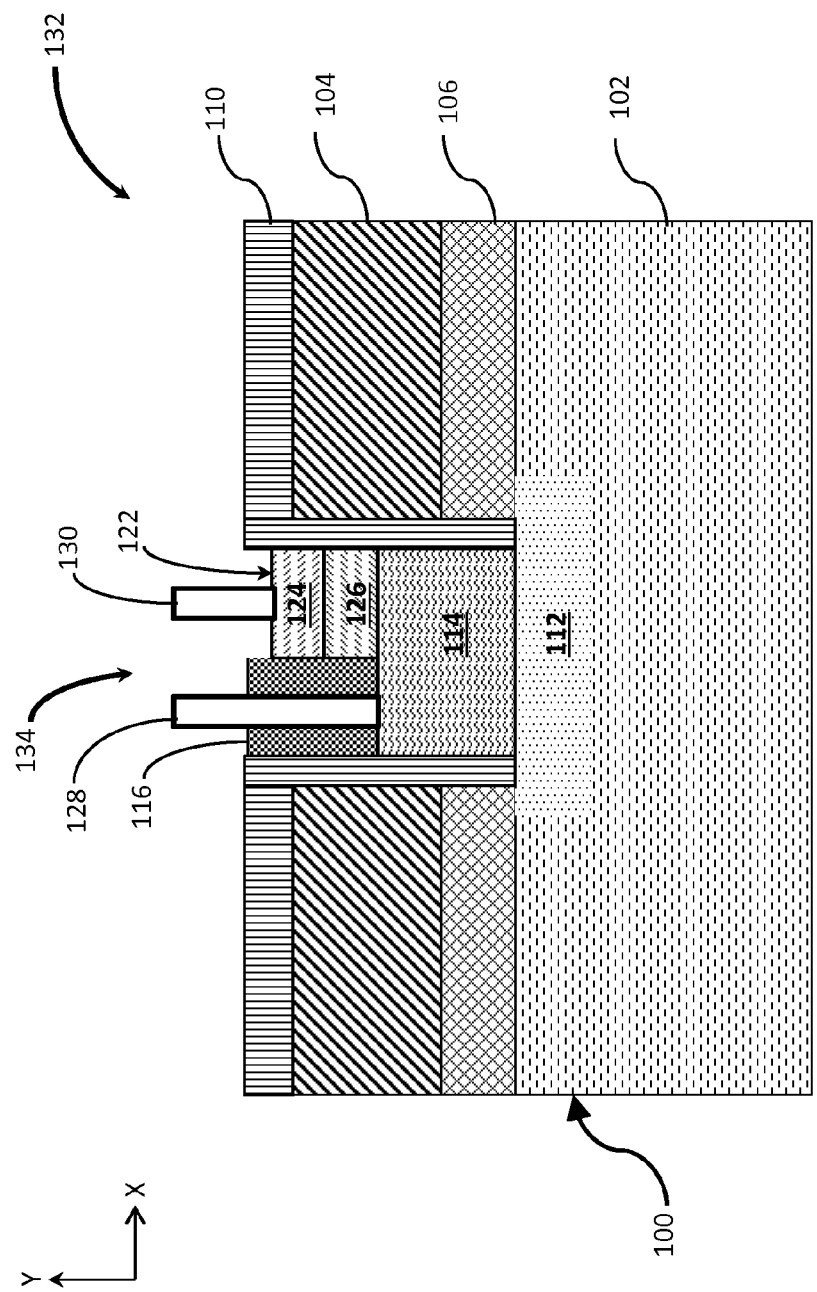

Referring now to FIG. 13, first and second electrically conductive terminals are formed in the trench 108. More specifically, a first terminal 128 is disposed through the isolation element 116. One end of the first terminal 128 is exposed to an exterior of the SOI substrate 100, while an opposite end is in electrical contact with the first doped region 114. The isolation element 116 electrically isolates the first terminal 128 from the second doped portion 122. The second terminal 130 includes one end that is exposed to the exterior of the SOI substrate 100, while an opposite end is in electrical contact with the second doped region 122. In at least one embodiment, the opposite end of the second terminal 130 contacts only the heavy doped portion 124 of the second doped region 122. According to yet another related embodiment, the second terminal 130 may be about half the size of the first terminal 128, and each may extend a vertical distance that is less than the width of the BOX layer 106.

According to the above-described process flow, a semiconductor device 132 such as, for example a fin field effect transistor (finFET), may be fabricated, as further illustrated in FIG. 13. The semiconductor device 132 may include a first doped region 114, a doped well 112 and a second doped region 122 to form an ESD protection device such as, for example, an ESD diode 134 that is arranged vertically within the trench 108 of an SOI substrate 100. More specifically, the first doped region 114 forms a P-type anode region 114 and the second doped region 122 forms an N-type cathode region 122. The doped well 112 forms a depletion layer 112 realized by the anode region 114 and the cathode region 122. Current may flow from the first terminal 128, i.e., the anode terminal 128, to the second terminal 130, i.e., the cathode terminal 130, via a current path through the anode region 114, the depletion region 112 and the cathode region 122 as understood by those of ordinary skill in the art. The depletion region 112 allows flow of a forward biased current, but inhibits a reversed biased current, i.e., current from re-entering the SOI substrate via the cathode region 122.

Referring further to FIG. 13, the first and second doped regions, e.g., the anode and cathode regions 114, 122, are formed externally from the doped well 112, e.g., the depletion region 112. In at least one embodiment, the anode region 114 and the cathode region 122 are stacked vertically with respect to one another. Accordingly, the anode region 114 may be disposed between the depletion region 112 and the cathode region 122. As a result, an ESD protection device such as, for example, and ESD diode 134 may be formed vertically within a trench 108 such that the anode and cathode regions 114,122 are formed externally from the depletion layer 112. This allows the electrical connections of the corresponding terminals to be decreased, thereby allowing the overall size of semiconductor device 132 to be reduced.

Figure 14:
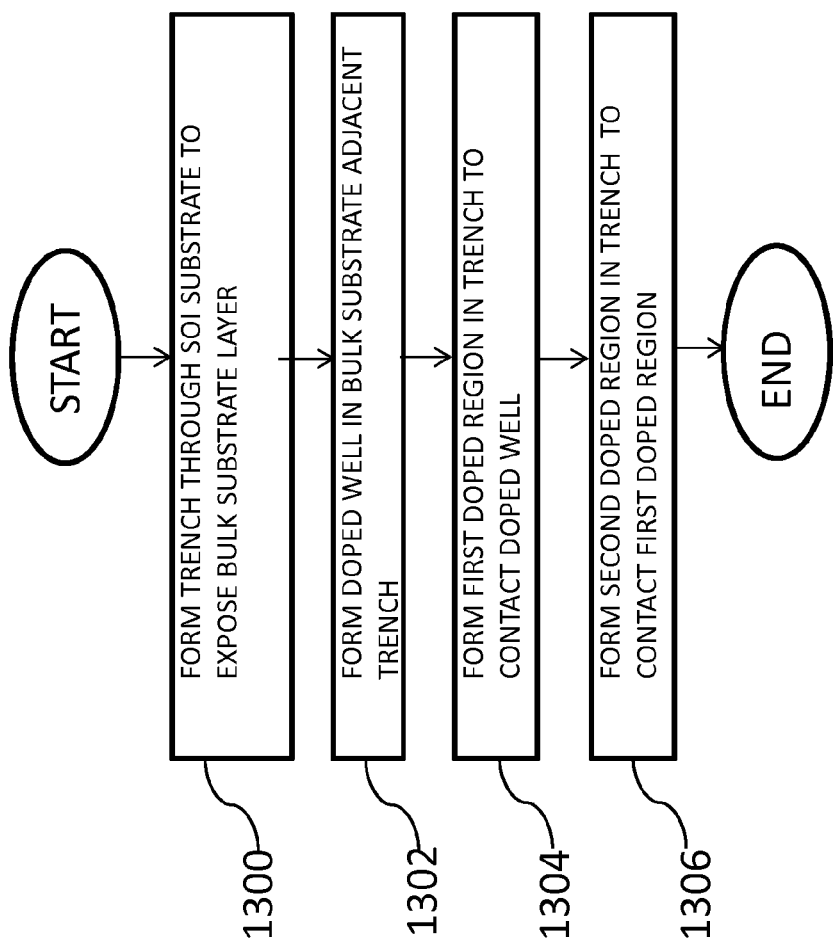
FIG. 14 is a flow diagram illustrating a method of fabricating a semiconductor device including an ESD protective device.

Referring now to FIG. 14, a method of fabricating a semiconductor device is illustrated according to an embodiment. At operation 1300, a trench is formed through an SOI substrate to expose a bulk substrate layer. The trench may be formed according to various methods including, but not limited to, RIE. At operation 1302, a doped well such as, for example, an N-well depletion region is formed in the exposed portion of the bulk substrate layer. At operation 1304, a first doped region is formed in the trench to electrically contact the doped well. The first doped region may include positively charged ions to form an anode region. A second doped region may be formed in the trench to electrically contact the first doped region at operation 1306 and the method ends. The second doped region may include negatively charged ions to form a cathode region. Accordingly, a semiconductor device such as, for example, a finFET may include an anode region, a depletion region and a cathode region that forms an ESD diode in a trench of an SOI substrate. Further, the anode region and cathode region may be disposed between an active semiconductor layer and a bulk substrate layer of the SOI substrate.

Figure 15:
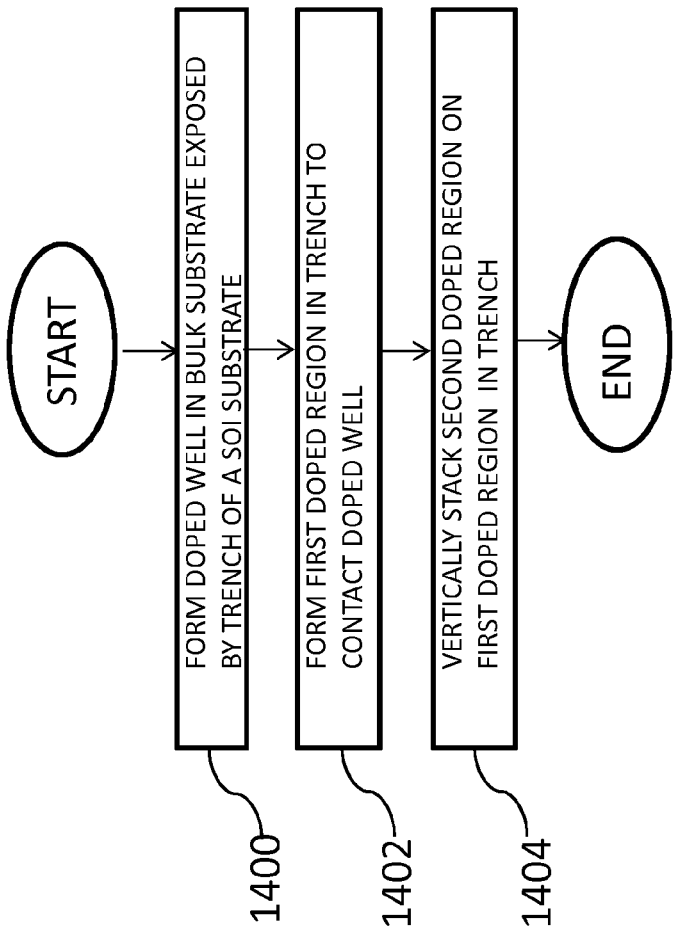
FIG. 15 is a flow diagram illustrating a method of fabricating an ESD protective device.

Referring now to FIG. 15, a method of fabricating an ESD protection device is illustrated according to an embodiment. At operation 1400, a doped well is formed in a bulk substrate layer and below a trench formed in a SOI substrate. At operation 1402, first doped region is formed in a in the trench to contact the doped well. A second doped region is stacked vertically on the first doped region to form an electrical connection thereto at operation 1404, and the method ends.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The descriptions of various embodiments have been presented for purposes of illustration and description, but is not intended to be exhaustive or limited to the embodiments disclosed. Many modifications and variations will be apparent to those of ordinary skill in the art without departing from the scope and spirit of the subject-matter. The various embodiments are described in order to best explain the principles of the subject-matter and the practical application, and to enable others of ordinary skill in the art to understand the various embodiments with various modifications, as are suited to the particular use contemplated.

The flow diagrams depicted herein are just one example. There may be many variations to this diagram or the operations described therein without departing from the spirit of the disclosed subject-matter. For instance, the operations may be performed in a differing order. In addition, operations may be added, deleted or modified. All of these variations are considered a part of the claimed subject-matter.

While various embodiments have been described, it will be understood that those skilled in the art, both now and in the future, may make various modifications, which fall within the scope of the following claims. These claims should be construed to maintain the proper protection for the claims recited below.

The invention claimed is:

1. A semiconductor device, comprising:
   a semiconductor-on-insulator (SOI) substrate including a bulk substrate layer, an active semiconductor layer and a buried insulator layer disposed between the bulk substrate layer and the active semiconductor layer;
   a trench formed through the active semiconductor layer and the buried insulator layer of the SOI substrate to expose the bulk substrate layer;

a doped well formed in an upper region of the bulk substrate layer adjacent trench; and a first doped region formed in the trench and directly on the doped well, the first doped region being different from the doped well, wherein the first doped region is disposed between the doped well and a second doped region such that the first doped region and the second doped region are contained in the trench, the doped well and the second doped region each doped with ions having a first electrical polarity and the first doped region doped with ions having a second electrical polarity different from the first doped region.

2. The semiconductor device of claim 1, wherein the second doped region is formed in the trench, the second doped region being different from the doped well and the first doped region.

3. The semiconductor device of claim 2, wherein the first and second doped regions are formed externally from the doped well.

4. The semiconductor device of claim 3, wherein the doped well, the first doped region and the second doped region are stacked vertically with respect to one another.

5. The semiconductor device of claim 1, wherein the first doped region is an anode region comprising positively doped ions and the second doped region is a cathode region comprising negatively doped ions, and wherein the anode region, the doped well and the cathode region form a vertical diode disposed completely within the trench.

6. The semiconductor device of claim 5, wherein the cathode region includes a light doped portion comprising ions ranging in amount from $1\times10^{10}$ to $1\times10^{20}$, and a heavy doped portion comprising ions ranging in amount from $5\times10^{10}$ to $5\times10^{20}$.

7. The semiconductor device of claim 6, wherein the light doped portion is disposed between the anode region and the heavy doped portion.

8. The semiconductor device of claim 7, further comprising an anode terminal extending a first vertical distance to contact a portion of the anode region, and a cathode terminal extending a second vertical distance to contacting the heavy doped portion, the second vertical distance being less than the first vertical distance.

9. An electrostatic discharge (ESD) protection device, comprising:

a doped well formed in a bulk substrate layer of a semiconductor-on-insulator (SOI) substrate;

a first doped region formed in a trench of the SOI substrate and directly on the doped well, the trench formed through an active semiconductor layer and a buried insulator layer of the SOI substrate ; and a second doped region different from the first doped region, the second doped region formed vertically in the trench of the SOI substrate with respect to the first doped region, wherein the first doped region is disposed between the doped well and the second doped region such that the first doped region and the second doped region are contained in the trench, the doped well and the second doped region each doped with ions having a first electrical polarity and the first doped region doped with ions having a second electrical polarity different from the first doped region.

10. The ESD protection device of claim 9, wherein the first and second doped regions are formed externally from the doped well.

11. The ESD protection device of claim 10, wherein the first doped region is an anode region and the second doped region is a cathode region.

12. The ESD protection device of claim 11, wherein the cathode region includes a heavy doped portion comprising a first amount of doped impurities and a light doped portion comprising a second amount of doped impurities that is less than the first amount.

13. The ESD protection device of claim 12, further comprising an anode terminal to contact the anode region and a cathode terminal to contact the cathode region, the anode and cathode terminals each extending a vertical distance that is less than a vertical width of the buried insulator layer.

14. A method of fabricating a semiconductor device, the method comprising:

forming a trench through an active semiconductor layer and a buried insulator layer of a semiconductor-on-insulator (SOI) substrate to expose a bulk substrate layer, the SOI substrate including the bulk substrate layer, the active semiconductor layer and the buried insulator layer disposed between the bulk substrate layer and the active semiconductor layer;

forming a doped well in the bulk substrate layer adjacent the trench; and forming at least one doped region in the trench to contact the doped well, the at least one doped region being different from the doped well, wherein the at least one doped region includes a first doped region that is disposed between the doped well and a second doped region such that the first doped region and the second doped region are each contained in the trench, the doped well and the second doped region each doped with ions having a first electrical polarity and the first doped region doped with ions having a second electrical polarity different from the first doped region.

15. The method of claim 14, wherein the forming at least one doped region further comprises forming the first and second doped regions externally from the doped well.

16. The method of claim 15, wherein the forming the first and second doped regions includes stacking vertically the doped well, the first doped region and the second doped region with respect to one another.

17. The method of claim 14, further comprising forming the first doped region as an anode and forming the second doped region as a cathode.

18. A method of fabricating an electrostatic discharge (ESD) protection device, comprising:

forming a doped well in a bulk substrate layer of a semiconductor-on-insulator (SOI) substrate;

forming a first doped region in a trench of the SOI substrate and directly on the doped well, the trench formed through an active semiconductor layer and a buried insulator layer of the SOI substrate; and forming a second doped region in the trench of the SOI substrate, the second doped region being different from the first doped region and formed vertically with respect to the first doped region, wherein the first doped region is disposed between the doped well and the second doped region, the doped well and the second doped region each doped with ions having a first electrical polarity and the first doped region doped with ions having a second electrical polarity different from the first doped region.

19. The method of claim 18, further comprising forming the first and second doped regions completely external from the doped well.

20. The method of claim 18, wherein the first doped region is an anode region and the second doped region is a cathode region.

21. The method of claim 20, wherein the cathode region includes a heavy doped portion comprising first amount of doped impurities and a light doped portion comprising a second amount of doped impurities less than the first amount.

* * * * *